(12) United States Patent
Itoh et al.

(10) Patent No.: US 11,508,836 B2
(45) Date of Patent: Nov. 22, 2022

(54) SEMICONDUCTOR DEVICE INCLUDING TRENCH GATE STRUCTURE WITH SPECIFIC VOLUME RATIO OF GATE ELECTRODES

(71) Applicant: DENSO CORPORATION, Kariya (JP)

(72) Inventors: Masakazu Itoh, Kariya (JP); Hiroki Sakane, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/862,790

(22) Filed: Apr. 30, 2020

(65) Prior Publication Data
US 2020/0312986 A1 Oct. 1, 2020

Related U.S. Application Data

(63) Continuation of application No. PCT/JP2018/040772, filed on Nov. 1, 2018.

(30) Foreign Application Priority Data

Nov. 3, 2017 (JP) .............................. JP2017-213329

(51) Int. Cl.
*H01L 29/739* (2006.01)
*H01L 29/08* (2006.01)
(Continued)

(52) U.S. Cl.
CPC ...... *H01L 29/7397* (2013.01); *H01L 29/0804* (2013.01); *H01L 29/413* (2013.01); *H01L 29/41708* (2013.01)

(58) Field of Classification Search
CPC ............. H01L 29/7397; H01L 29/0804; H01L 29/413; H01L 29/41708; H01L 29/515;
(Continued)

(56) References Cited

U.S. PATENT DOCUMENTS

| 6,423,618 | B1 * | 7/2002 | Lin | .................. | H01L 29/66621 |
| | | | | | 257/E21.429 |
| 2004/0079989 | A1 * | 4/2004 | Kaneko | ............. | H01L 29/66068 |
| | | | | | 257/328 |

(Continued)

FOREIGN PATENT DOCUMENTS

JP H04-268734 A 9/1992
JP 2007-088010 A 4/2007
(Continued)

*Primary Examiner* — Wasiul Haider
(74) *Attorney, Agent, or Firm* — Posz Law Group, PLC

(57) ABSTRACT

A semiconductor device includes a semiconductor substrate, multiple trench gate structures and an emitter region. The semiconductor substrate includes: a drift layer of a first conductivity type; a base layer of a second conductivity type disposed on the drift layer; and a collector layer of the second conductivity type, the collector layer disposed at a position opposite to the base layer with the drift layer sandwiched between the base layer and the collector layer. Each of the trench gate structures includes: a trench penetrating the base layer and reaching the drift layer; a gate insulation film is disposed at a wall surface of the trench; and a gate electrode disposed on the gate insulation film. The emitter region is disposed on a surface layer portion of the base layer and is in contact with the trench.

5 Claims, 6 Drawing Sheets

(51) Int. Cl.
*H01L 29/41* (2006.01)
*H01L 29/417* (2006.01)

(58) Field of Classification Search
CPC ............ H01L 29/4236; H01L 29/4916; H01L 29/0649; H01L 29/42376; H01L 29/78; H01L 21/28
See application file for complete search history.

(56) References Cited

U.S. PATENT DOCUMENTS

| | | | |
|---|---|---|---|
| 2004/0229420 A1* | 11/2004 | Shibata | H01L 29/518 438/202 |
| 2006/0081903 A1 | 4/2006 | Inoue et al. | |
| 2006/0292805 A1* | 12/2006 | Kawamura | H01L 29/7397 257/E29.198 |
| 2007/0001263 A1 | 1/2007 | Nakagawa | |
| 2014/0217464 A1* | 8/2014 | Higuchi | H01L 29/1095 257/139 |
| 2015/0048413 A1* | 2/2015 | Arakawa | H01L 29/7397 257/139 |
| 2015/0295071 A1* | 10/2015 | Hikasa | H01L 29/4958 257/144 |
| 2017/0145259 A1* | 5/2017 | Choo | C09K 3/1409 |
| 2017/0179267 A1 | 6/2017 | Hikasa | |
| 2018/0096849 A1* | 4/2018 | Burke | H01L 29/7889 |
| 2019/0006497 A1 | 1/2019 | Hikasa | |

FOREIGN PATENT DOCUMENTS

| | | | |
|---|---|---|---|
| JP | 2007088010 | * | 4/2007 |
| JP | 2014-232895 A | | 12/2014 |

* cited by examiner

SEMICONDUCTOR DEVICE INCLUDING TRENCH GATE STRUCTURE WITH SPECIFIC VOLUME RATIO OF GATE ELECTRODES

CROSS REFERENCE TO RELATED APPLICATIONS

The present application is a continuation application of International Patent Application No. PCT/JP2018/040772 filed on Nov. 1, 2018, which designated the U.S. and claims the benefit of priority from Japanese Patent Application No. 2017-213329 filed on Nov. 3, 2017. The entire disclosures of all of the above applications are incorporated herein by reference.

TECHNICAL FIELD

The present disclosure relates to a semiconductor device.

BACKGROUND

A semiconductor device having an IGBT may be adopted in an electronic equipment such as an industrial motor.

SUMMARY

The present disclosure describes a semiconductor device having a trench gate insulated gate bipolar transistor (also referred to as IGBT).

BRIEF DESCRIPTION OF DRAWINGS

The above object, the other objects, features, and advantages of the present disclosure will become more apparent from the following detailed description with reference to the accompanying drawings, in which.

DETAILED DESCRIPTION

Figure 1:
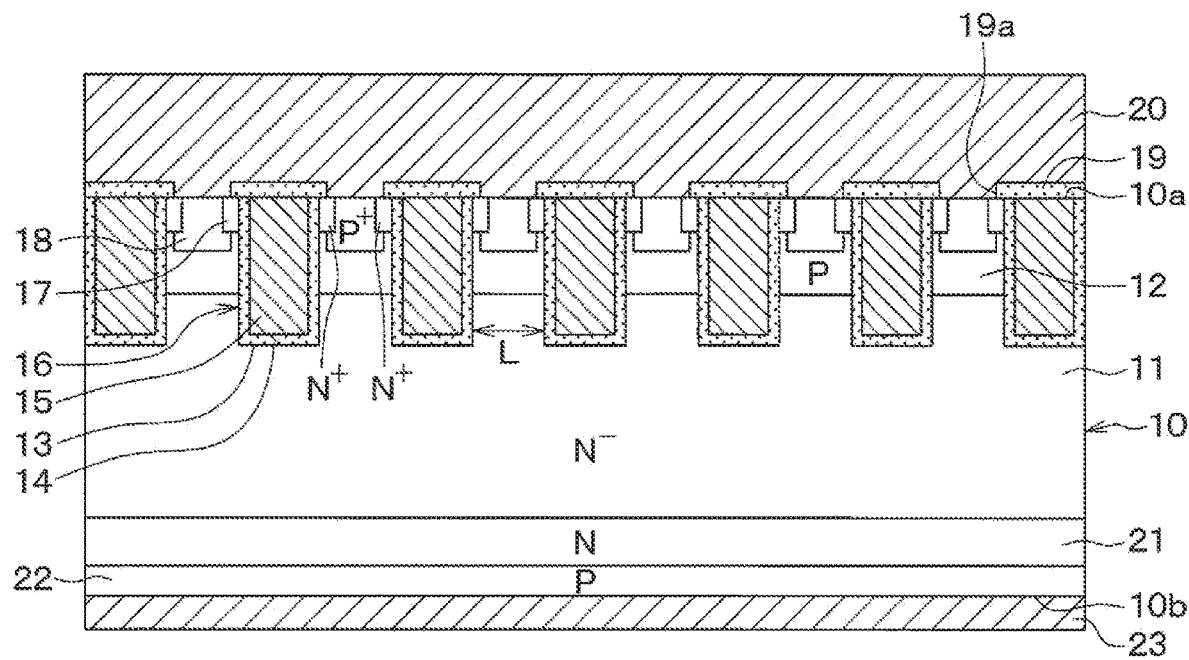
FIG. 1 is a cross-sectional view of a semiconductor device in a first embodiment.

A semiconductor device may be applied as one of the semiconductor devices for power conversion. More specifically, in the above semiconductor device, a base layer is formed on a surface layer portion of a semiconductor substrate as an $N^-$-type drift layer, and multiple trenches are provided to penetrate through the base layer of the semiconductor substrate. In each trench, a gate insulation film and a gate electrode are embedded in order. The gate insulation film includes an oxide film, and the gate electrode includes polysilicon. An $N^-$ type emitter region is formed on a surface layer portion of the base layer to be in contact with the trenches. A $P^+$-type collector layer is formed at the other surface of the semiconductor substrate. An emitter electrode is formed at a first surface of the semiconductor substrate. The emitter electrode is electrically connected to the base layer and the emitter region. A collector electrode is formed at a second surface of the semiconductor substrate. The collector electrode is electrically connected to the collector layer.

Such a semiconductor device may be fabricated as follows. A base layer is formed on a drift layer, and then a trench reaching the drift layer is formed. A gate insulation film is formed in the trench. Amorphous silicon doped with impurities is deposited by a CVD (Chemical Vapor Deposition) method. Thermal treatment crystallizes the amorphous silicon to polysilicon to form a gate electrode having the polysilicon. A semiconductor manufacturing process is performed to form an emitter region, a collector layer, an emitter electrode, a collector electrode, and the like. Therefore, the semiconductor device is manufactured.

The semiconductor device may have stress around the gate electrode through thermal contraction at a time of crystallizing the amorphous silicon to the polysilicon and after the time of crystallization. In other words, the stress may be generated in a region around the trench of the semiconductor substrate. When the stress is large, crystal defect may occur in the polysilicon included in the gate electrode and deterioration of the gate insulation film is accelerated. The semiconductor device may have breakdown as an electric current flows through the semiconductor device.

According to an aspect of the present disclosure, a semiconductor device includes a semiconductor substrate, multiple trench gate structures, an emitter region of a first conductivity type, a first electrode and a second electrode. The semiconductor substrate includes: a drift layer of the first conductivity type; a base layer of a second conductivity type disposed on the drift layer; and a collector layer of the second conductivity type disposed at a position opposite to the base layer with the drift layer sandwiched between the base layer and the collector layer. Each of the multiple trench gate structures has: a trench penetrating the base layer and reaching the drift layer, and extending in an extending direction as one of surface directions of the semiconductor substrate; a gate insulation film disposed at a wall surface of the trench; and a gate electrode disposed on the gate insulation film. The emitter region is disposed on a surface layer portion of the base layer and is in contact with the trench. The first electrode is electrically connected to the base layer and the emitter region. The second electrode electrically connected to the collector layer. The gate electrode includes polysilicon. The trench at the semiconductor substrate has a largest stress equal to or less than 340 MPa around the trench.

Since the maximum stress generated around the trench is 340 MPa or smaller, it may be possible to inhibit a situation of breakdown of the semiconductor device.

The following describes one or more embodiments of the present disclosure with reference to the drawings. In the following respective embodiments, parts identical with or equivalent to each other are denoted by the same symbols for description.

First Embodiment

The following describes a first embodiment. A semiconductor device according to the present embodiment may be used as a power switching element in power supply circuits such as inverters and DC/DC converters.

As shown in FIG. 1, the semiconductor device includes a semiconductor substrate 10 having an N⁻-type drift layer 11. In the present embodiment, the semiconductor substrate 10 includes a silicon substrate. A P-type base layer 12 is formed on the drift layer 11 (that is, on a first surface 10a of the semiconductor substrate 10).

Multiple trenches 13 are provided in the semiconductor substrate 10 to penetrate through the base layer 12 and reach the drift layer 11. As a result, the base layer 12 is partitioned into multiple pieces by the trenches 13. In the present embodiment, the multiple trenches 13 are formed at regular intervals in a stripe manner along one of surface directions of the first surface 10a of the semiconductor substrate 10. Each trench 13 is formed such that the interval L between adjacent trenches 13 is equal.

In the present embodiment, each trench 13 is formed such that the side surface of the trench 13 is substantially parallel to a direction normal to the first surface 10a of the semiconductor substrate 10. The term "substantially parallel" includes not only a situation where the semiconductor substrate 10 is completely parallel, but also a situation where the angle between the first surface 10a of the semiconductor substrate 10 and the side surface of the trench 13 may be up to about 85°.

A gate insulation film 14 is formed at a wall surface of each trench 13. A gate electrode 15 is formed at the gate insulation film 14. As a result, a trench gate structure 16 is formed. In the present embodiment, the gate electrode 15 is embedded inside the trench 13.

The gate insulation film 14 includes an oxide film, and is formed along the wall surface of the trench 13 with a uniform thickness of about 100 nm (or 1000 angstrom). The gate electrode 15 includes polysilicon doped with impurities. The gate electrode 15 is formed by forming an amorphous silicon film through a CVD method and then performing heat treatment to crystallize the amorphous silicon into polysilicon. The grain size (also referred to as grain diameter) of the polysilicon is in a range of 50 nm to 1000 nm.

N⁺-type emitter regions 17 having an impurity concentration higher than that of the drift layer 11 and P⁺-type contact regions 18 having an impurity concentration higher than that of the base layer 12 are formed on a surface layer portion of the base layer 12 (that is, on the first surface 10a of the semiconductor substrate 10). The emitter regions 17 terminate in the base layer 12 and are in contact with side surfaces of the trenches 13. Similar to the emitter regions 17, the contact regions 18 terminate in the base layer 12.

The emitter region 14 is extended in a bar shape along the longitudinal direction of the trench 13 in the region between the trenches 13 so as to come in contact with the side surface of the trench 13, and terminates at the inner side of a leading end of the trench 13. The contact region 18 is sandwiched between the two emitter regions 17 and extends in a rod shape along the longitudinal direction of the trench 13 (that is, the emitter region 17). The contact regions 18 according to the present embodiment are formed deeper than the emitter regions 17 with respect to the first surface 10a of the semiconductor substrate 10.

An interlayer insulating film 19 formed of borophosphosilicate glass (also referred to as BPSG) or the like is formed on the first surface 10a of the semiconductor substrate 10. An emitter electrode 20 is formed on the interlayer insulating film 19 so as to be electrically connected to the emitter regions 17 and the contact regions 18 (that is, the base layer 12) through contact holes 19a provided in the interlayer insulating film 18. In the present embodiment, the emitter electrode 20 corresponds to a first electrode.

An N-type field stop layer (referred to as an FS layer) 21 having an impurity concentration higher than that of the drift layer 11 is formed on a side of the drift layer 11 opposite to the base layer 12 (that is, on the side of a second surface 10b of the semiconductor substrate 10). The FS layer 21 may not be needed, but is provided to improve characteristics of breakdown voltage and steady loss by preventing spread of a depletion layer, and control implantation amount of holes injected from the side of the second surface 10b of the semiconductor substrate 10.

A P-type collector layer 22 is formed at a side opposite to the drift layer 11 with the FS layer 20 interposed between the drift layer 11 and the collector layer 22. The collector electrode 23 electrically connected to the collector layer 22 is formed on the collector layer 22 (that is, on the second surface 10b of the semiconductor substrate 10). In the present embodiment, the collector electrode 23 corresponds to a second electrode.

The structure of the semiconductor device according to the present embodiment is described above. In the present embodiment, the N-type, the N⁻-type, and the N⁻-type correspond to a first conductivity type. The P-type and the P⁺-type correspond to a second conductivity type. In the present embodiment, the semiconductor substrate 10 includes the collector layer 22, the FS layer 21, the drift layer 11, the base layer 12, the emitter region 17 and the contact region 18.

The following describes an operation of the semiconductor device.

When the semiconductor device is turned on from the off-state, the emitter electrode 20 is grounded and a positive voltage is applied to the collector electrode 23. A predetermined voltage is applied to the gate electrode 15 from a gate control circuit (not shown), such that the gate electric potential becomes equal to or larger than a threshold voltage Vth of the insulated gate structure. In the semiconductor device, an N-type inversion later (that is, a channel) is formed in a portion of the base layer 12 in contact with the trench 13. In the semiconductor device, electrons are supplied from the emitter electrode 20 to the drift layer 11 through the emitter region 17 and the inversion layer. In the semiconductor device, the holes are supplied from the collector electrode 23 to the drift later 11 through the collector layer 22. In the semiconductor device, the resistance value of the drift layer 11 decreases due to conductivity modulation and then the semiconductor device is turned on.

When the gate electrode 15 is turned off from the on-state, a predetermined value (for example, 0V) is applied from the gate control circuit (not shown) to the gate electrode 15 such that the gate electric potential is lower than the threshold value Vth. In the semiconductor device, the inversion layer, which is formed in the portion of the base layer 12 in contact with the trench 13, disappears. Therefore, the electrons are not supplied from the emitter electrode 20 and the holes are not supplied from the collector electrode 23, and thus the semiconductor is turned off.

Figure 2:
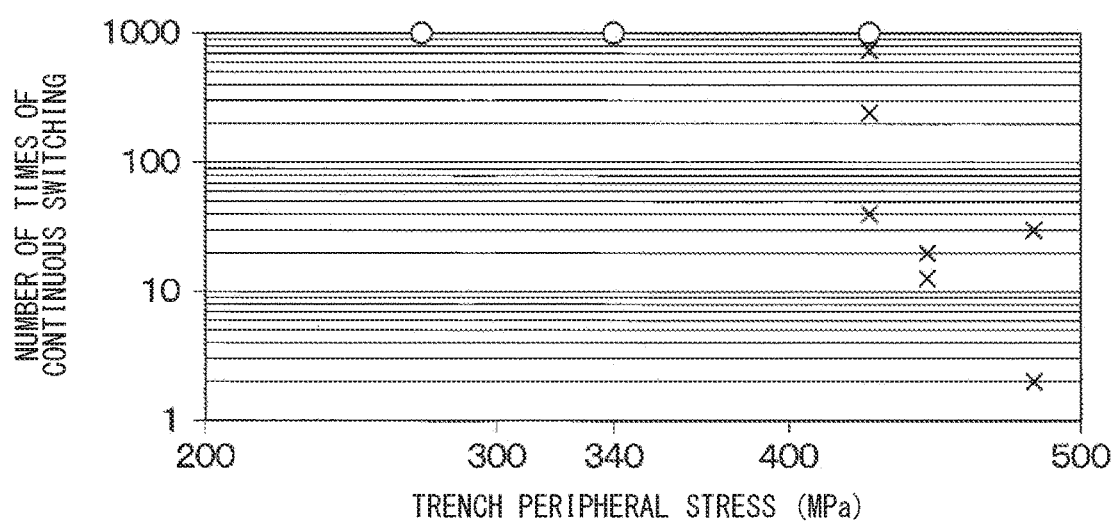
FIG. 2 illustrates a simulation result indicating a relationship between stress around a trench and a breakdown of the semiconductor device.

The following describes a relationship between trench peripheral stress around the trench 13 and the breakdown of the semiconductor device with reference to FIG. 2. The trench peripheral stress refers to a stress generated at the formation of the gate electrode 15, and also refers to the largest one of the stresses generated around the trench 13. The trench peripheral stress in FIG. 2 indicates the largest one of the stresses around the trench 13 located at the center of the semiconductor device, the trench 13 located at the outer edge of the semiconductor device, the trench located between the center and the outer edge of the semiconductor device, and the like. That is, the trench peripheral stress in FIG. 2 indicates the largest one of the stresses around the trench 13 of the semiconductor device. The stress generated around the trench 13 has the maximum at a predetermined location in a region between adjacent trenches 13, since the stresses which are caused by the respective gate electrodes 15 disposed in the adjacent trenches 13 are applied together.

The stress around the trench in FIG. 2 is a value analyzed by Electron Back Scatter Diffraction (also referred to as EBSD). With regard to the number of continuous switching in FIG. 2, one-time switching refers to an operation of turning on the semiconductor device from the off-state and turning off the semiconductor device from the on-state.

As illustrated in FIG. 2, in a situation where the trench peripheral stress is 340 MPa or smaller, it is confirmed that the breakdown of the semiconductor device does not occur even if the switching is executed 1000 times. On the other hand, in a situation where the trench peripheral stress is 340 MPa or larger, it is confirmed that the breakdown of the semiconductor device does not occur even if the switching is executed 1000 times. However, it is also confirmed that the breakdown of the semiconductor device may occur when the switching is executed less than 1000 times. For example, in a situation where the trench peripheral stress is 420 MPa, it is confirmed that the breakdown of the semiconductor device occurs even if the switching is performed less than 1000 times. When the trench peripheral stress further increases, it is confirmed that the breakdown of the semiconductor device occurs, in a situation where switching is executed about ten to several tens of times. In other words, it is confirmed that the breakdown of the semiconductor device may occur with lesser number of times of switching as the trench peripheral stress increases. For this reason, the trench peripheral stress is 340 MPa or smaller in the semiconductor device according to the present embodiment.

FIG. 2 illustrates a case where the thickness of the semiconductor substrate 10 is 80 μm. However, the trench peripheral stress may not vary even if the thickness of the semiconductor substrate 10 or the impurity concentration of each region is changed. In other words, irrespective of the thickness of the semiconductor substrate 10 or the impurity concentration of each region, the breakdown of the semiconductor device may be inhibited in a situation where the trench peripheral stress is 340 MPa or smaller.

The trench peripheral stress is caused by the polysilicon in the gate electrode 15. The trench peripheral stress is caused by crystallization of the amorphous silicon to polysilicon and thermal contraction after the crystallization. Therefore, it is possible to change the trench peripheral stress by adjusting the amount of polysilicon in the gate electrode 15.

Figure 3:
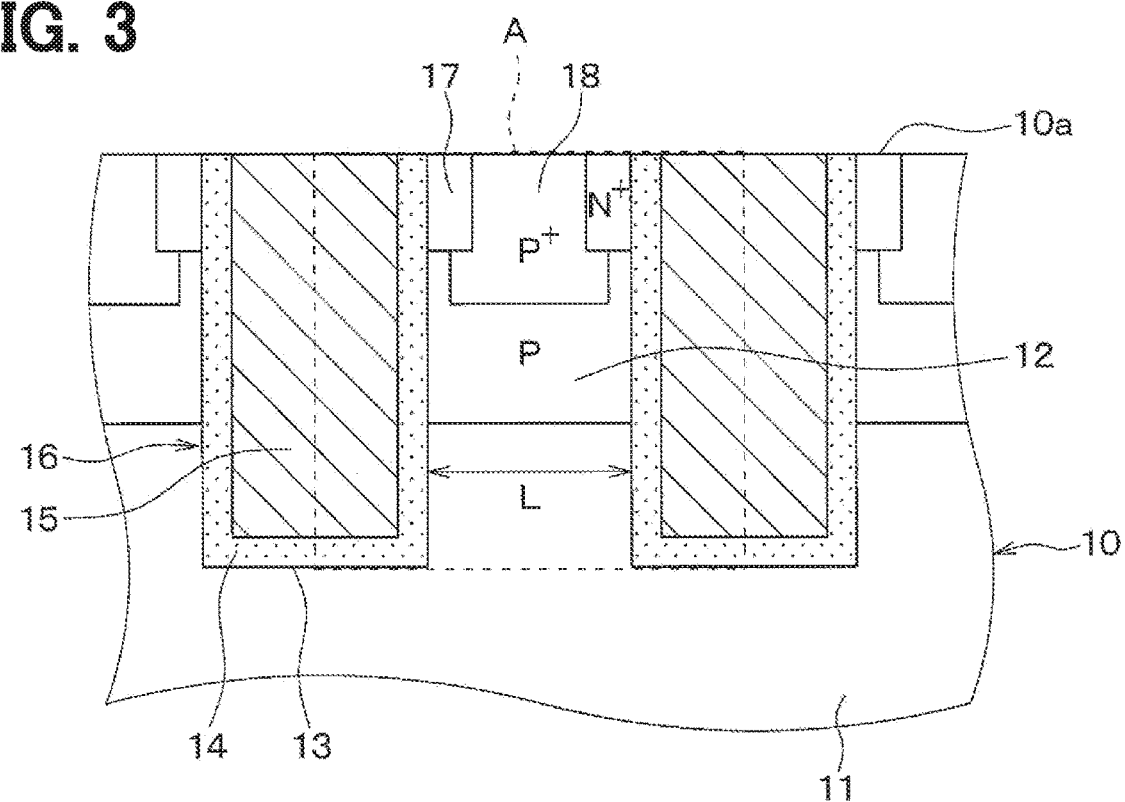
FIG. 3 is a schematic diagram illustrating one-cell region of the semiconductor device in FIG. 1.

FIG. 3 is a cross sectional view in which the extending direction of the trench 13 is the normal direction, and corresponds to an enlarged view of the surrounding of the trench gate structure in FIG. 1. In a region of the cross sectional view of FIG. 3 from the first surface 10a of the semiconductor substrate 10 to the bottom part of the trench gate structure 16, one-cell region A is defined from the center of the trench gate structure 16 to the center of the adjacent gate trench 16. The contact region 18 is sandwiched between the trench gate structure 16 and the adjacent trench gate structure 16. In other words, in the region of the cross sectional view of FIG. 3 from the first surface 10a of the semiconductor substrate 10 to the bottom part of the trench gate structure 16, the one-cell region A is a region surrounded by the central axis of the trench gate structure 16 and the central axis of the adjacent trench gate structure 16. In the region of the cross sectional view of FIG. 3 from the first surface 10a of the semiconductor substrate 10 to the bottom part of the trench gate structure 16, the one-cell region A is a region surrounded by two virtual lines along the normal direction to the first surface 10a of the semiconductor substrate 10 through the respective centers of the adjacent trench gate structures 16. In FIG. 3, the region surrounded by a dotted line is one-cell region A. The bottom part of the trench 13 is a part farthest from the first surface 10a of the semiconductor substrate 10, and is the bottom surface of the trench 13 in FIG. 3.

Figure 4:
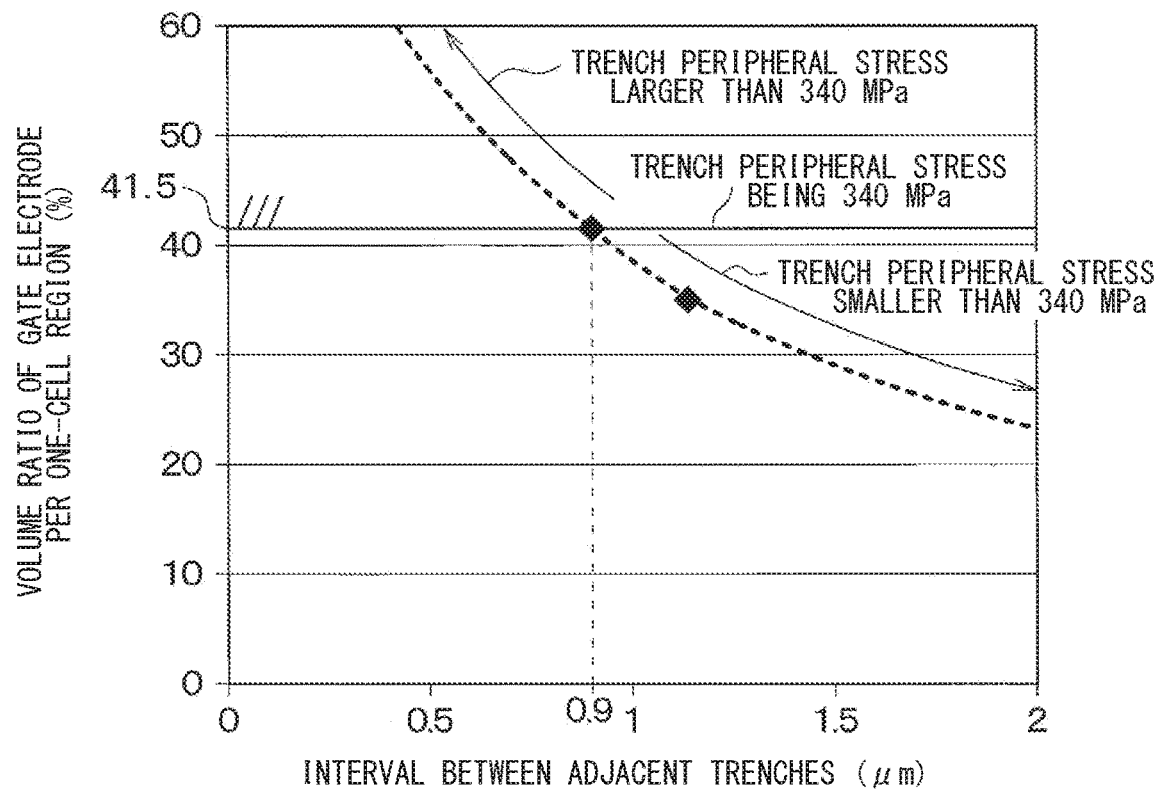
FIG. 4 illustrates a simulation result indicating relationship between a trench pitch (also referred to as an interval between adjacent trenches) and a volume ratio of a gate electrode per cell region.

The inventors of the present application had conducted studies based on the volume ratio of the gate electrode 15 (in other words, polysilicon) per one-cell region A and obtained the following results. As shown in FIG. 4, the inventors found out that the trench peripheral stress is 340 MPa or smaller, in a situation where the volume ratio of the gate electrode 15 is 41.5% or smaller.

Therefore, the volume ratio of the gate electrode 15 is set to 41.5% or smaller. In order to reduce the volume ratio of the gate electrode 15, the total volume of the one-cell region A may be increased by widening the interval L between the adjacent trenches 13. In the present embodiment, the interval L between the adjacent trenches 13 is set to 0.9 μm or larger. Therefore, it is possible to adjust the trench peripheral stress to 340 MPa or smaller.

Figure 5:
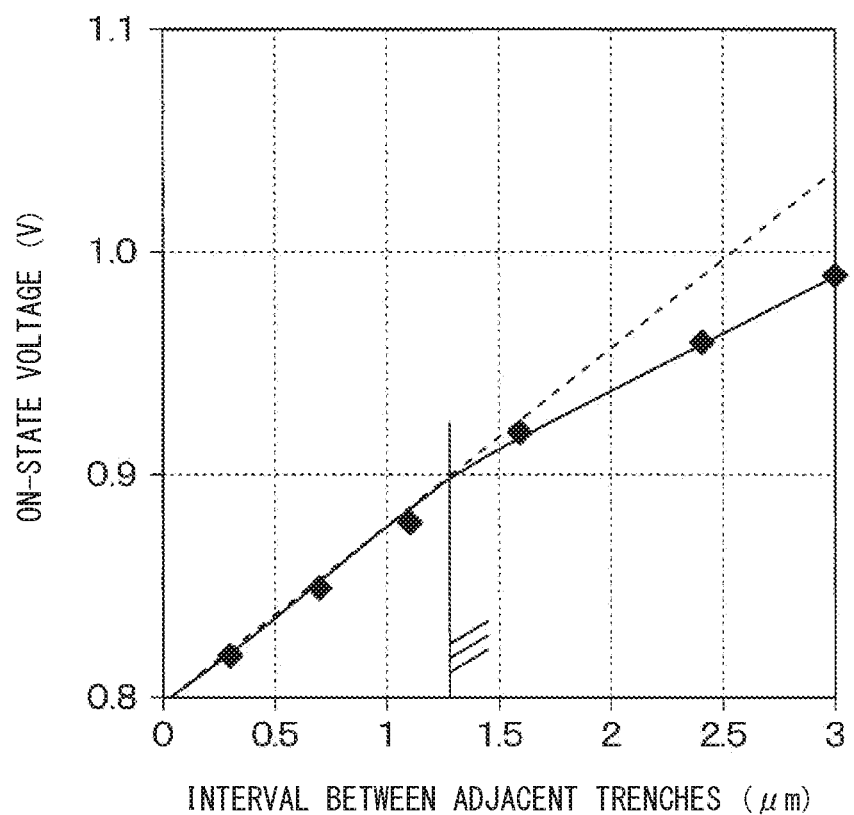
FIG. 5 illustrates a relationship between the trench pitch and an on-state voltage.

As shown in FIG. 5, when the semiconductor device is at the on-state, the holes supplied to the drift layer 11 easily escape to the base layer 12 as the interval L between the adjacent trenches 13 increases. Therefore, the on-state voltage increases. In the semiconductor device including IGBT having the trench gate structure according to the present embodiment, it may be desirable to have the on-state voltage to be 0.9V or smaller. The rate of change in the on-state voltage in a range where the interval L between the trenches 13 is longer than 1.3 μm is smaller than the rate of change in the on-state voltage in a range where the interval L between the trenches 13 is shorter than 1.3 μm. In other words, in the semiconductor device, when the interval between the adjacent trenches 13 is 1.3 μm or smaller, the on-state voltage decreases rapidly as the interval between the adjacent trenches 13 decreases. In the present embodiment, the interval between the adjacent trenches is set to 1.3 μm or smaller. The narrowest interval between adjacent trenches 13 may be defined as the interval L between the adjacent trenches 13.

In the present embodiment, the volume ratio of the gate electrode 15 per one-cell region A is set to 41.5% or smaller so that the trench peripheral stress is 340 MPa or smaller. Therefore, it is possible to inhibit the breakdown of the semiconductor device.

The interval L between the adjacent trenches 13 is set to 1.3 μm or smaller. Therefore, it is possible to inhibit an increase in the on-state voltage while inhibiting the breakdown of the semiconductor device.

Second Embodiment

The following describes a second embodiment. The present embodiment is a modification of the first embodiment in the configuration of the trench gate structure 16, and other configurations are same as those in the first embodiment, so that description of the other configurations is omitted.

Figure 6:
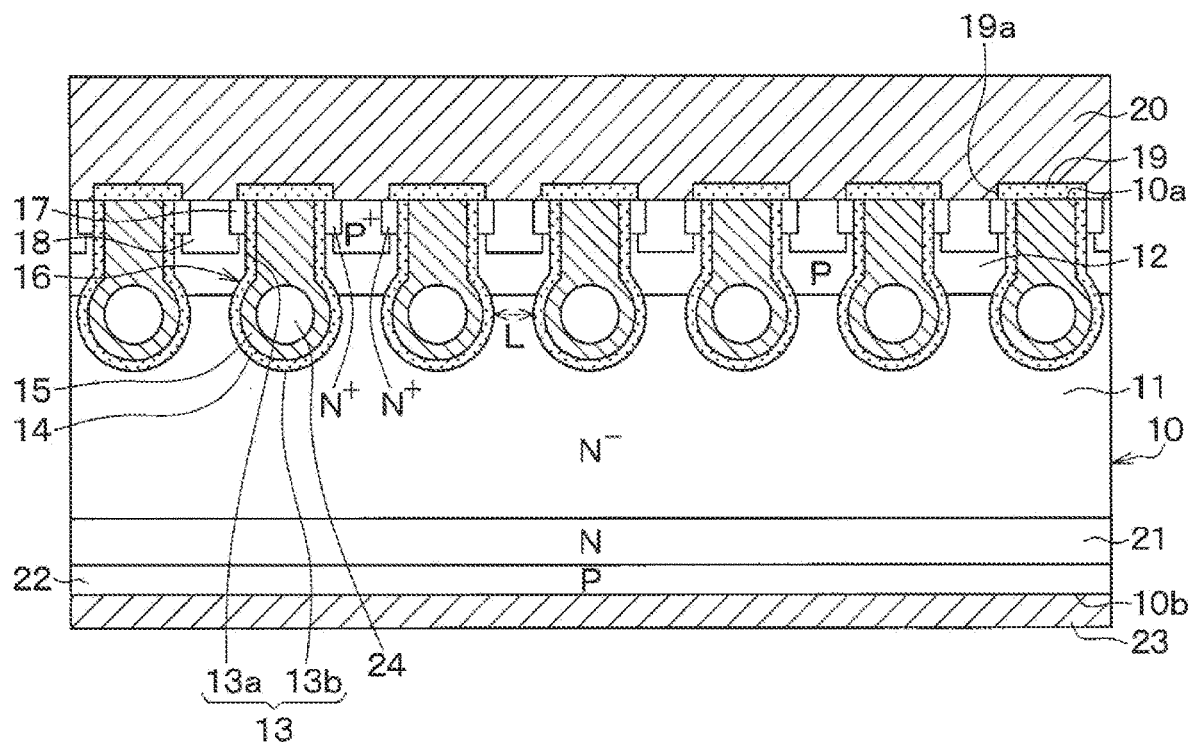
FIG. 6 is a cross-sectional view of a semiconductor device according to a second embodiment.

As illustrated in FIG. 6, the trench 13 includes a first trench 13a and a second trench 13b. The first trench 13a is disposed at the opening of the trench 13. The second trench 13b is disposed at the bottom part of the trench 13. The first trench 13a and the second trench 13b are interconnected. The first trench 13a is formed inside the base layer 12. The second trench 13b reaches the drift layer 11 from the vicinity of the interface between the base layer 12 and the drift layer 11 inside the base layer 12. In other words, the second trench 13b is formed from the base layer 12 to the drift layer 11.

In a cross-sectional view of FIG. 6, the second trench 13b includes a substantially circular shape having a portion where the interval between opposing side surfaces of the second trench 13b is longer than the interval between opposing side surfaces of the first trench 13a. In other words, the trench 13 has a so-called pot shape.

The interval between opposing side surfaces is a length in a left-right direction (horizontal direction) as viewed on the drawing of FIG. 6. The interval L between the adjacent trenches 13 is the narrowest interval among the intervals between the adjacent trenches 13. Therefore, the interval L is the narrowest interval between the adjacent second trenches 13b.

The gate electrode 15 is formed through the gate insulation film 14 at the wall surface of the trench 13 so that a gap 24 is formed inside the gate electrode 15. The gate electrode 15 is formed so that the gap 24 is formed inside the second trench 13b.

Figure 7:
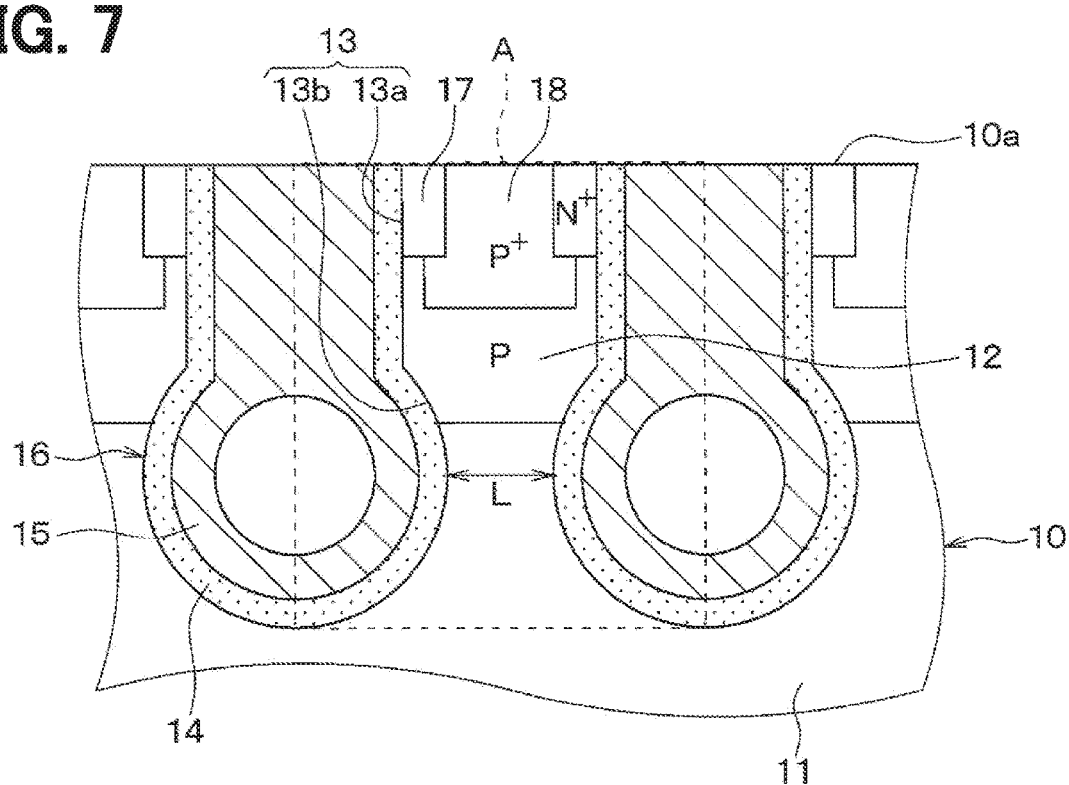
FIG. 7 is a schematic view of one-cell region in the semiconductor device illustrated in FIG. 6.

The above describes the configuration of the semiconductor device according to the present embodiment. The following describes a volume ratio of the gate electrode 15 according to the present embodiment with reference to FIG. 7. FIG. 7 is a cross-sectional view in which the extending direction of the trench 13 is set as a normal direction. FIG. 7 corresponds to an enlarged view of the surrounding of the trench gate structure 16 in FIG. 6.

Figure 8:
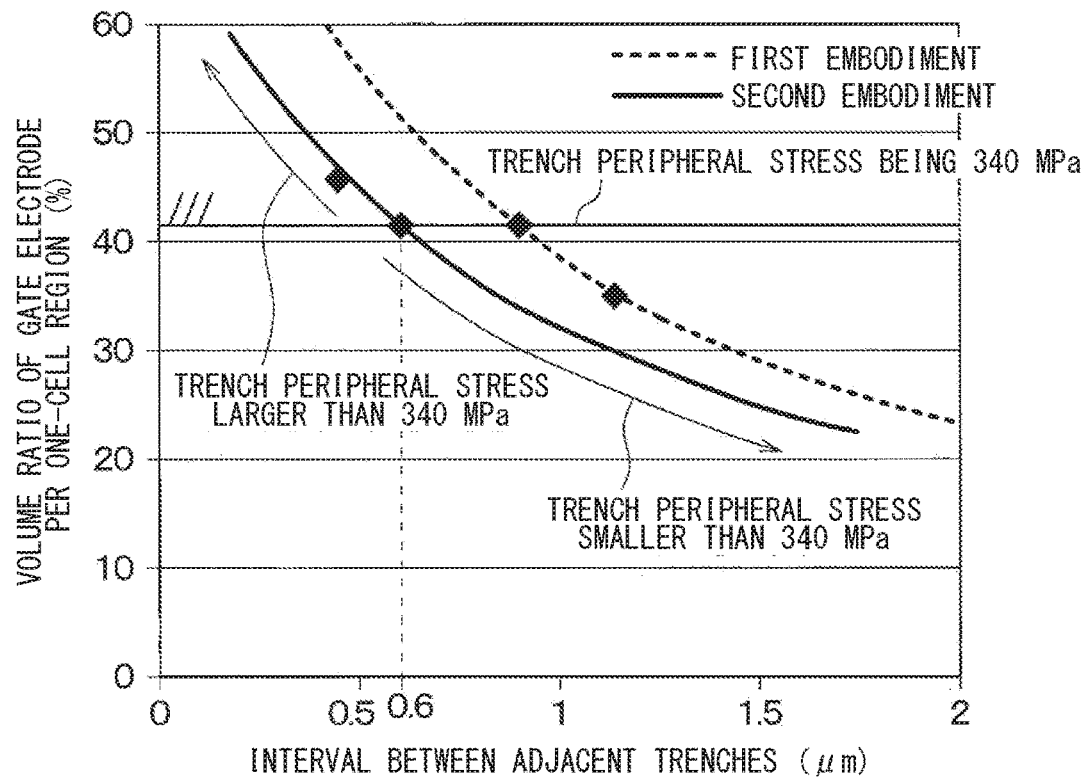
FIG. 8 shows a simulation result indicating a relationship between a trench pitch and a volume ratio of a gate electrode per one-cell region in the second embodiment.

As illustrated in FIG. 7, one-cell region A is a region including the gap 24 surrounded by a dotted line in the drawing in a cross-sectional view where the extending direction of the trench 13 is set as the normal direction. The stress at the formation of the gate electrode 15 is moderated at the gap 24. As illustrated in FIG. 8, in a situation where the volume ratio of the gate electrode 15 is 41.5%, the interval L between the adjacent trenches 13 is about 0.6 μm. The interval between the adjacent trenches 13 may be made shorter than the one described in the first embodiment. Therefore, the holes supplied to the drift layer 11 may be hardly removed through the base layer 12, in a situation where the semiconductor device is at the on-state. According to the present embodiment, it is possible to reduce the on-state voltage while inhibiting the breakdown of the semiconductor device.

FIG. 8 shows a simulation result when the volume ratio of the gap 24 per one-cell region A is 8%. In a situation where the volume ratio of the gate electrode 15 is 41.5%, the interval L between adjacent trenches 13 further decreases if the volume ratio of the gap 24 per one-cell region A is made larger than 8%. In a situation where the volume ratio of the gate electrode 15 is 41.5%, the interval between adjacent trenches 13 increases if the volume ratio of the gap 24 per one-cell region A is made smaller than 8%.

The following describes a method for manufacturing the semiconductor device. The semiconductor substrate 10 having the base layer 12 on the drift layer 11 is provided, and the first trench 13a is formed by anisotropic etching such as reactive ion etching. A mask for protecting the side surface of the first trench 13a is formed, and the isotropic etching is performed on the button surface of the first trench 13a. The second trench 13b, which is interconnected with the first trench 13a, is formed. The second trench 13b has a portion where the interval between the opposing side surfaces of the second trench 13b is longer than the interval between the opposing side surfaces of the first trench 13a.

Subsequently, the gate insulation film 14 is formed by CVD method, thermal oxidation or the like. After amorphous silicon is formed on the gate insulation film 14 by the CVD method or the like, the amorphous silicon is crystallized into polysilicon by thermal treatment to form the gate electrode 15. When the amorphous silicon is formed by the CVD method, the amorphous silicon is formed almost uniformly on the gate insulation film 14. When the amorphous silicon is formed by the CVD method, the first trench 13a is embedded before the second trench 13b is completely embedded, and the gap 24 is formed inside the second trench 13b.

Subsequently, a semiconductor manufacturing process is performed to form the emitter region 17, the contact region 18, the interlayer insulation film 19, the emitter electrode 20, the FS layer 21, the collector layer 22, the collector electrode 23 and the like. Therefore, the semiconductor device is manufactured.

In the present embodiment, the gap 24 is formed inside the gate electrode 15, and the stress at the formation of the gate electrode 15 is moderated at the gap 24. In comparison with the first embodiment, in a situation where the volume ratio of the gate 15 is 41.5%, the interval between adjacent trenches 13 may be shortened. Therefore, it is possible to inhibit the breakdown of the semiconductor device while inhibiting a further increase in the on-state voltage.

Other Embodiments

Although the disclosure has been described in accordance with embodiments, it is understood that the present disclosure is not limited to the embodiments or structures described above. The present disclosure encompasses various modifications and variations within the scope of equivalents. Furthermore, various combination and formation, and other combination and formation including one, more than one or less than one element may be made in the present disclosure.

For example, according to the first embodiment, an example has been described in which the first conductivity type is N-type and the second conductivity type is P-type, but the first conductivity type may be P-type and the second conductivity type may be N-type.

Figure 9:
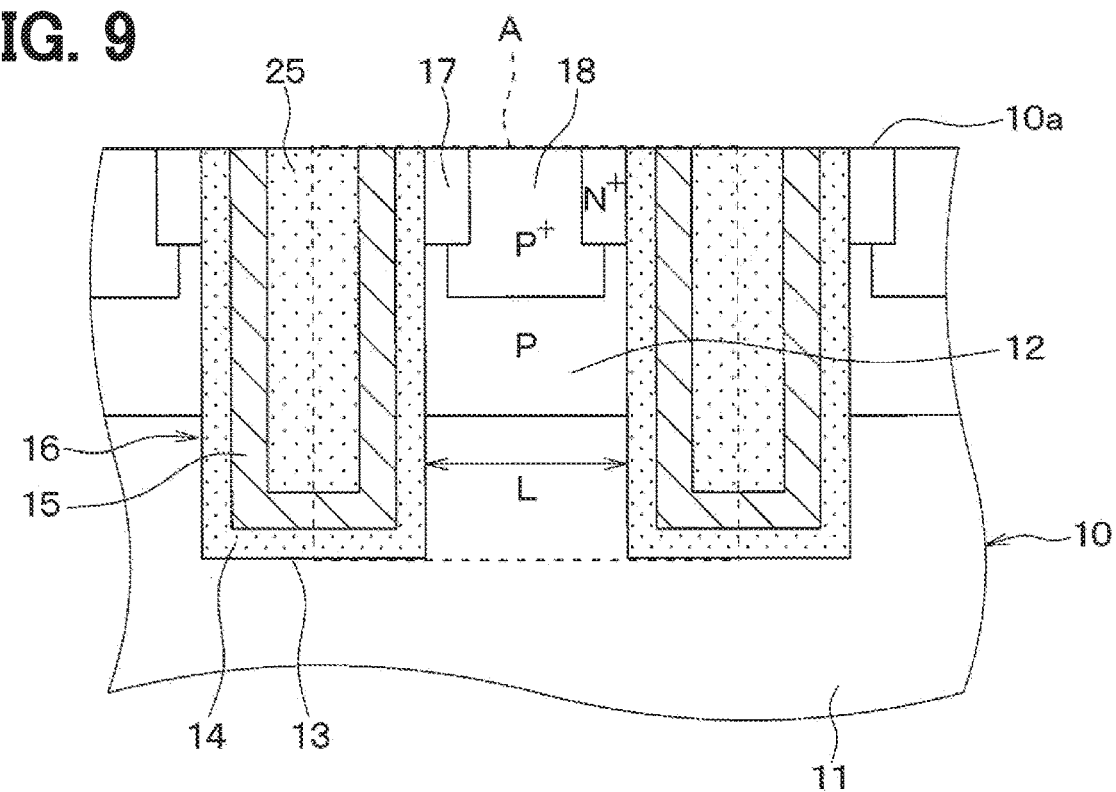
FIG. 9 is a diagram showing a trench gate structure and one-cell region in other embodiments.

In the first embodiment, the following configuration may be adopted to set the volume ratio of the gate electrode 15 to 41.5% or smaller while setting the interval L between adjacent trenches 13 to 0.9 μm or smaller. As shown in FIG. 9, the volume ratio of the gate electrode 15 may be set to 41.5% or smaller by forming the gate electrode 15 along the wall surface of the trench 13 and embedding an embedded film 25 inside the gate electrode 15. The embedded film 25 is formed by forming an oxide film by, for example, CVD method.

Figure 10:
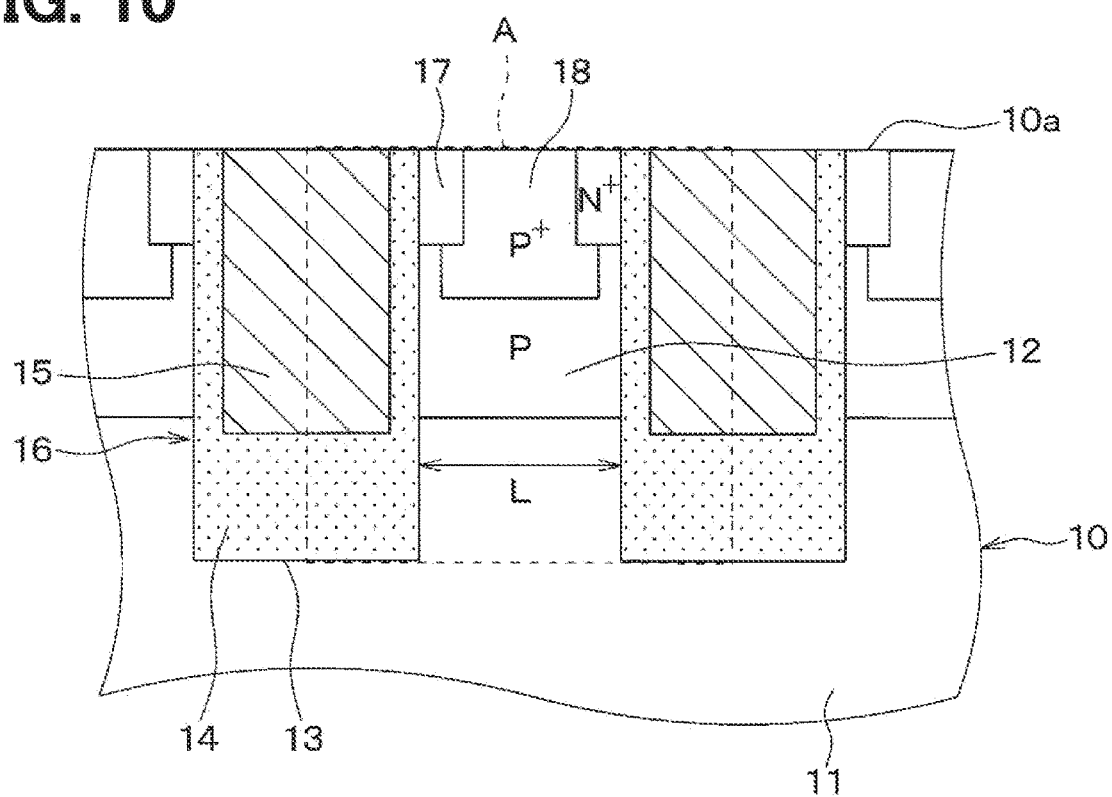
FIG. 10 is a diagram showing a trench gate structure and one-cell region in the other embodiments.

As illustrated in FIG. 10, the volume ratio of the gate electrode 15 may be set to 41.5% or smaller by increasing the thickness of the portion of the gate insulation film 14 disposed at the bottom of the trench 13. Therefore, it is possible to inhibit a situation where an electric field is concentrated at the bottom of the trench 13.

Figure 11:
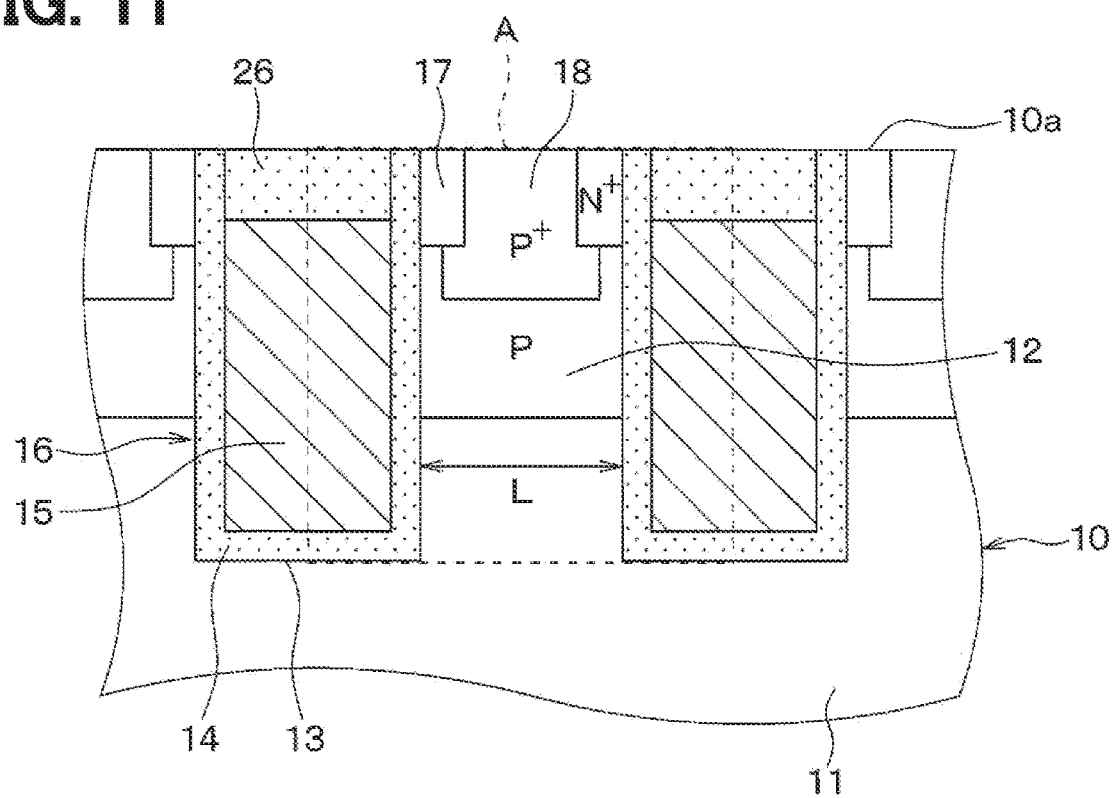
FIG. 11 is a diagram showing a trench gate structure and one-cell region in the other embodiments.

As illustrated in FIG. 11, an embedded film 26 may be formed at the opening of the trench 13. Since the gate electrode 15 is formed at a portion in contact with the base layer 12 through the gate insulation film 14, the gate electrode 15 may not be formed at a portion opposite to the emitter region 17 with the gate insulation film 14 interposed between the gate electrode 15 and the base layer 12. Therefore, it is possible to decrease the volume ratio of the gate electrode 15 by forming the embedded film 26 opposite to the emitter region 17 with the gate insulation film 14 interposed between the embedded film 26 and the emitter region 17. The embedded film 26 is formed by forming the oxide film through, for example, the CVD method.

Although not particularly shown in the drawings, each configuration may be combined with other configuration. For example, the configuration of FIG. 9 may be combined with the configuration of FIG. 10. It is possible to dispose the embedded film 25 and increase the thickness of a portion of the gate insulation film 14 disposed at the bottom of the trench 13. The configuration of FIG. 9 may be combined with the configuration of FIG. 11. It is possible to include both of the embedded film 25 and the embedded film 26. The configuration of FIG. 10 may be combined with the configuration of FIG. 11. It is possible to increase the thickness of a portion of the gate insulation film 14 disposed at the bottom of the trench 13 and include the embedded film 26. The respective configurations of FIGS. 9 to 11 may be combined. It is possible to include the embedded film 25 and the embedded film 26 while increasing the thickness of the gate insulation film 14 at the bottom of the trench 13.

In each of the embodiments, the semiconductor device may also be an RC-IGBT including an N-type cathode layer and the collector layer 22 at the second surface 10b of the semiconductor substrate 10. RC may be referred to as reverse-conducting.

In each of the embodiments, the multiple trenches 13 may have different intervals L between adjacent trenches. Even with such a configuration, the similar effects as described above may also be achieved if the largest trench peripheral stress is 340 MPa or smaller.

What is claimed is:
1. A semiconductor device comprising:
a semiconductor substrate including
   a drift layer of a first conductivity type,
   a base layer of a second conductivity type disposed on the drift layer, and
   a collector layer of the second conductivity type, the collector layer disposed at a position opposite to the base layer with the drift layer sandwiched between the base layer and the collector layer;
a plurality of trench gate structures including at least a first trench gate structure and a second trench gate structure being adjacent to each other, each trench gate structure having
   a trench penetrating the base layer and reaching the drift layer, the trench extending in an extending direction as one of surface directions of the semiconductor substrate,
   a gate insulation film disposed at a wall surface of the trench, and
   a gate electrode disposed on the gate insulation film;
an emitter region of the first conductivity type, the emitter region disposed on a surface layer portion of the base layer and being in contact with the trench;
a first electrode electrically connected to the base layer and the emitter region; and
a second electrode electrically connected to the collector layer;
wherein the gate electrode includes polysilicon having a grain size in a range of 50 nanometers to 1000 nanometers,
wherein the semiconductor device has a one-cell region in a cross sectional area in which the extending direction is a normal direction,
wherein the one-cell region is surrounded by a central axis of the first trench gate structure and a central axis of the second trench gate structure, and is between a surface of the semiconductor substrate and a bottom part of each of the first trench gate structure and the second trench gate structure,
wherein the gate electrodes per one cell region have a volume ratio of 41.5 percent or less,
wherein the trench at the semiconductor substrate has a largest stress equal to or less than 340 MPa around the trench,
wherein an interval between the first trench gate structure and the second trench gate structure is within a range of 0.9 micrometers or larger and 1.3 micrometers or smaller, and
wherein the gate electrode is disposed only inside the trench.
2. The semiconductor device according to claim 1, wherein the gate insulation film has an oxide film, and has a thickness
equal to or smaller than 100 nanometers.
3. The semiconductor device according to claim 1, wherein the volume ratio is less than or equal to 35 percent.
4. The semiconductor device according to claim 1, wherein a thickness of the gate insulation film at a bottom part of the trench is larger than a thickness of the gate insulation film at a part of the trench other than the bottom part of the trench.
5. A semiconductor device comprising:
a semiconductor substrate including
   a drift layer of a first conductivity type,
   a base layer of a second conductivity type disposed on the drift layer, and
   a collector layer of the second conductivity type, the collector layer disposed at a position opposite to the base layer with the drift layer sandwiched between the base layer and the collector layer;
a plurality of trench gate structures including at least a first trench gate structure and a second trench gate structure being adjacent to each other, each trench gate structure having
   a trench penetrating the base layer and reaching the drift layer, the trench extending in an extending direction as one of surface directions of the semiconductor substrate,
   a gate insulation film disposed at a wall surface of the trench, and
   a gate electrode disposed on the gate insulation film;

an emitter region of the first conductivity type, the emitter region disposed on a surface layer portion of the base layer and being in contact with the trench;
a first electrode electrically connected to the base layer and the emitter region; and
a second electrode electrically connected to the collector layer,
wherein the gate electrode includes polysilicon having a grain size in a range of 50 nanometers to 1000 nanometers,
wherein the semiconductor device has a one-cell region in a cross sectional area in which the extending direction is a normal direction,
wherein the one-cell region is surrounded by a central axis of the first trench gate structure and a central axis of the second trench gate structure, and is between a surface of the semiconductor substrate and a bottom part of each of the first trench gate structure and the second trench gate structure,
wherein the gate electrodes per one cell region have a volume ratio of 41.5 percent or less,
wherein the trench at the semiconductor substrate has a largest stress equal to or less than 340 Mpa around the trench,
wherein the gate electrode has a gap inside the gate electrode,
wherein an interval between the first trench gate structure and the second trench gate structure is within a range of 0.6 micrometers or larger and 1.3 micrometers or smaller, and
wherein the gate electrode is disposed only inside the trench.

* * * * *